US012684287B2

(12) United States Patent
Wang et al.

(10) Patent No.: US 12,684,287 B2
(45) Date of Patent: Jul. 14, 2026

(54) IMPEDANCE DEVICES AND SYSTEMS FOR SIMULATING IMPACT OF HEAD ON VIBRATION OF VIBRATION UNIT

(71) Applicant: SHENZHEN SHOKZ CO., LTD., Guangdong (CN)

(72) Inventors: Zhen Wang, Shenzhen (CN); Zhiqing Liu, Shenzhen (CN); Lei Zhang, Shenzhen (CN)

(73) Assignee: SHENZHEN SHOKZ CO., LTD., Shenzhen (CN)

( * ) Notice: Subject to any disclaimer, the term of this patent is extended or adjusted under 35 U.S.C. 154(b) by 286 days.

(21) Appl. No.: 18/328,761

(22) Filed: Jun. 4, 2023

(65) Prior Publication Data

US 2023/0351870 A1 Nov. 2, 2023

Related U.S. Application Data

(63) Continuation of application No. PCT/CN2022/128431, filed on Oct. 28, 2022.

(30) Foreign Application Priority Data

Dec. 24, 2021 (WO) ................ PCT/CN2021/141078

(51) Int. Cl.
H04R 1/28 (2006.01)
G08B 6/00 (2006.01)
(Continued)

(52) U.S. Cl.
CPC .............. H04R 1/288 (2013.01); G08B 6/00 (2013.01); H03G 5/165 (2013.01);
(Continued)

(58) Field of Classification Search
CPC .... H04R 1/288; H04R 1/1008; H04R 1/1041; H04R 1/105; H04R 1/1091; H04R 2460/13
See application file for complete search history.

(56) References Cited

U.S. PATENT DOCUMENTS 5,624,377 A 4/1997 Davis
5,771,298 A 6/1998 Davis et al.
(Continued)

FOREIGN PATENT DOCUMENTS

CN 86107182 A 4/1987
CN 103644243 A 3/2014
(Continued)

OTHER PUBLICATIONS

The Extended European Search Report in European Application No. 22899614.6 mailed on Sep. 4, 2024, 10 pages.
(Continued)

*Primary Examiner* — Suhan Ni
(74) *Attorney, Agent, or Firm* — Metis IP LLC

(57) ABSTRACT

The present disclosure provides an impedance device and a system for simulating an impact of a head on a vibration of a vibration unit. The impedance device may include a mass part, an elastic part, and a fixing part. The mass part is connected to the fixing part through the elastic part. The fixing part is a hollow structure, the fixing part includes an opening. The elastic part is located at the opening and is connected to the fixing part. The elastic part forms a cavity with the fixing part. An elastic coefficient of the elastic part of a vibration direction in which the mass part vibrates relative to the fixing part in a range of 600 N/m~5000 N/m.

19 Claims, 10 Drawing Sheets

100

(51) Int. Cl.
    *H03G 5/16*       (2006.01)
    *H04R 1/10*       (2006.01)

(52) U.S. Cl.
    CPC ......... *H04R 1/1008* (2013.01); *H04R 1/1041*
        (2013.01); *H04R 1/105* (2013.01); *H04R*
        *1/1091* (2013.01); *H04R 2460/13* (2013.01)

(56) References Cited

U.S. PATENT DOCUMENTS

| | | | |
|---|---|---|---|
| 8,577,050 | B2 | 11/2013 | Margolis et al. |
| 2002/0122560 | A1 | 9/2002 | An |
| 2009/0028356 | A1 | 1/2009 | Ambrose et al. |
| 2009/0323995 | A1 | 12/2009 | Sibbald |
| 2014/0283614 | A1 | 9/2014 | Inagaki et al. |
| 2015/0124978 | A1 | 5/2015 | Johansen et al. |
| 2016/0123423 | A1 | 5/2016 | Iwaki |
| 2016/0320233 | A1 | 11/2016 | Inagaki |
| 2016/0353220 | A1 | 12/2016 | Inagaki et al. |
| 2017/0280216 | A1* | 9/2017 | Lee .......................... H04R 5/02 |
| 2019/0014425 | A1* | 1/2019 | Liao ..................... H04R 5/0335 |
| 2020/0186928 | A1 | 6/2020 | Sancisi |
| 2021/0256979 | A1 | 8/2021 | Zhang et al. |
| 2022/0360885 | A1 | 11/2022 | Wang et al. |
| 2023/0351870 | A1 | 11/2023 | Wang et al. |

FOREIGN PATENT DOCUMENTS

| | | | |
|---|---|---|---|
| CN | 105007551 | A | 10/2015 |
| CN | 106686496 | A | 5/2017 |
| CN | 107024537 | A | 8/2017 |
| CN | 207039903 | U | 2/2018 |
| CN | 208333665 | U | 1/2019 |
| CN | 208434106 | U | 1/2019 |
| CN | 110083911 | A | 8/2019 |
| CN | 112087700 | A | 12/2020 |
| DE | 102019000949 | A1 | 8/2020 |
| EP | 2785075 | A1 | 10/2014 |
| EP | 3007466 | A1 | 4/2016 |
| JP | H036821 | A | 1/1991 |
| JP | 2016201768 | A | 12/2016 |
| JP | 2018186572 | A | 11/2018 |
| JP | 2020129843 | A | 8/2020 |
| KR | 101390502 | B1 | 4/2014 |
| WO | 1998031191 | A1 | 7/1998 |

OTHER PUBLICATIONS

Decision to Grant a Patent for Invention in Japanese Application No. 2023-543180 mailed on Sep. 9, 2024, 5 pages.
International Search Report in PCT/CN2022/128431 mailed on Jan. 18, 2023, 6 pages.
International Search Report in PCT/CN2021/141078 mailed on Mar. 28, 2022, 6 pages.
Written Opinion in PCT/CN2021/141078 mailed on Mar. 28, 2022, 8 pages.
Notice of Preliminary Rejection in Korean Application No. 10-2023-7024683 mailed on Jun. 9, 2025, 8 pages.
First Office Action in Chinese Application No. 202280006815.3 mailed on Dec. 26, 2025, 17 pages.
First Examination Report in Indian Application No. 202217042480 mailed on Nov. 12, 2024, 7 pages.
Decision of Patent Grant in Korean Application No. 10-2022-7030167 mailed on Feb. 26, 2025, 3 pages.
The Second Office Action in Chinese Application No. 202111598684.6 mailed on May 29, 2025, 18 pages.
First Office Action in Chinese Application No. 202180019704.1 mailed on Dec. 31, 2024, 15 pages.
The Second Office Action in Chinese Application No. 202180019704.1 mailed on Jun. 23, 2025, 15 pages.
First Examination Report in Indian Application No. 202317041404 mailed on Dec. 23, 2025, 7 pages.

* cited by examiner

<u>100</u>

200

300A

300B

300C

300D

400

500

600

700

900

1200

IMPEDANCE DEVICES AND SYSTEMS FOR SIMULATING IMPACT OF HEAD ON VIBRATION OF VIBRATION UNIT

CROSS-REFERENCE TO RELATED APPLICATION

This application is a Continuation of International Patent Application No. PCT/CN2022/128431, filed on Oct. 28, 2022, which claims priority of International Patent Application No. PCT/CN2021/141078 filed on Dec. 24, 2021, the contents of each of which are entirely incorporated herein by reference.

TECHNICAL FIELD

The present disclosure relates to the field of vibration simulation, in particular to an impedance device and a system for simulating an impact of a head on a vibration of a vibration unit.

BACKGROUND

A vibration unit may generate a vibration signal to transmit the vibration signal to a human head (e.g., head bones). To simulate an impact of the human head on the vibration of the vibration unit so as to understand a vibration feature of the vibration unit, it is usually necessary to couple the vibration unit with a device that simulates a structure of the human head. In some application scenarios, when the vibration unit is used as a bone conduction earphone or a hearing aid, the vibration unit is fitted to a facial area on the front side of a user's auricle, and a bone hardness of this area in the human head is lower than that of a skull, a mastoid bone, etc., which means that a mechanical impedance of the facial area on the front side of the user's auricle is significantly different from that of other parts of the human head. However, the existing device that simulates the human head usually simulates the mechanical impedance of the mastoid behind the user's ear. Obviously, with the existing device, the simulation scenario where the vibration unit fits the facial area on the front side of the human auricle cannot be satisfied.

Therefore, it is necessary to provide an impedance device for simulating the facial area on the front side of the human auricle and a system for simulating the impact of the head on the vibration of the vibration unit.

SUMMARY

One of the embodiments of the present disclosure provides an impedance device. The impedance device includes a mass part, an elastic part, and a fixing part. The mass part is connected to the fixing part through the elastic part. The fixing part is a hollow structure and includes an opening. The elastic part is located at the opening and connected to the fixing part, and the elastic part and the fixing part form a cavity. An elastic coefficient of the elastic part in a vibration direction in which the mass part vibrates relative to the fixing part is in a range of 600 N/m~5000 N/m.

One of the embodiments of the present disclosure further provides a system for simulating an impact of a head on a vibration of a vibration unit. The system includes a vibration unit configured to provide a vibration signal, an impedance configured to contact the vibration unit and provide a mechanical impedance to the vibration unit, a connection part configured to couple the vibration unit to the impedance device, and a sensor configured to collect parameter information of the vibration unit during a vibration process. The impedance device includes a mass part, an elastic part, and a fixing part. The mass part is connected to the fixing part through the elastic part. The fixing part is a hollow structure including an opening. The elastic part is located at the opening and is connected to the fixing part. The elastic part forms a cavity with the fixing part. An elastic coefficient of the elastic part in a vibration direction in which the mass part vibrates relative to the fixing part is in a range of 600 N/m~5000 N/m.

DETAILED DESCRIPTION

Figure 1:
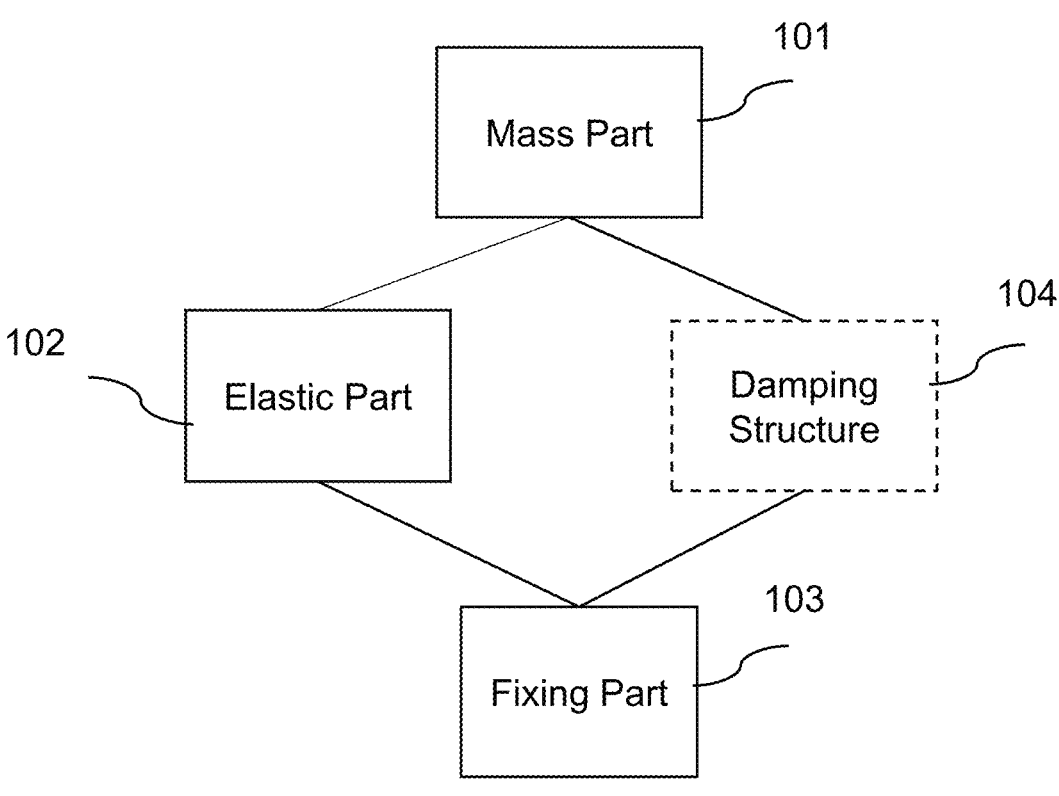
FIG. 1 is a block diagram illustrating an impedance device according to some embodiments of the present disclosure.

To more clearly illustrate the technical solutions of the embodiments of the present disclosure, the following briefly introduces the drawings that need to be used in the description of the embodiments. Obviously, the accompanying drawings in the following description are only some examples or embodiments of the present disclosure, and those skilled in the art may further apply the present disclosure to other similar scenarios. Unless obviously obtained from the context or the context illustrates otherwise, the same numeral in the drawings refers to the same structure or operation.

It should be understood that the "system", "device", "unit" and/or "module" as used herein is a method for distinguishing different parts, elements, parts, part s or assemblies of different levels. However, words may be replaced by other expressions if the other words can accomplish the same purpose.

As used in the disclosure and the appended claims, the singular forms "a," "an," and "the" include plural referents unless the content clearly dictates otherwise. Generally speaking, the terms "comprising" and "including" only suggest the inclusion of clearly identified steps and elements, and these operations and elements do not constitute an exclusive list, and the method or device may also contain other operations or elements.

The embodiment of the present disclosure describes an impedance device. In some embodiments, the impedance device may include a mass part, an elastic part and a fixing part, and the mass part is connected to the fixing part through the elastic part. In some embodiments, the fixing part is a hollow structure including an opening, the elastic part is located at the opening and connected with the fixing part, and the elastic part and the fixing part form a cavity. In addition, the mass part is connected to the elastic part, and under an action of an external force, the mass part may vibrate relative to the fixing part. To enable the impedance device to more accurately simulate a front area of an auricle of the human body, in some embodiments, an elastic coefficient of the elastic part in a vibration direction in which the mass part vibrates relative to the fixing part is in a range of 600 N/m to 5000 N/m. In some embodiments, the vibration of the mass part relative to the fixing part has a resonance peak within a frequency range of 20 Hz-300 Hz. In some embodiments, by adjusting a mass of the mass part and the elastic coefficient of the elastic part, a frequency response curve of the vibration unit (e.g., a bone conduction speaker, a hearing aid, etc.) when the vibration unit is coupled with the mass part of the impedance device and a frequency response curve when the vibration unit is worn near a tragus area of the human body (e.g., a facial area in front of the auricle) are approximately the same, and the impedance device may be used to simulate the impact on the vibration unit near the tragus area. In some embodiments, the impedance device may further include a damping structure. The damping structure may provide a damping for the impedance device, and the damping of the damping structure may be adjusted to simulate an actual impedance fed back to the vibration unit near the tragus area during an actual use, so that the frequency response curve when the vibration unit is coupled with the impedance device is the same or approximately the same with the frequency response curve of the vibration unit when the vibration unit is worn near the tragus area of the human body.

FIG. 1 is a block diagram illustrating an impedance device according to some embodiments of the present disclosure. As shown in FIG. 1, in some embodiments, an impedance device 100 may include a mass part 101, an elastic part 102, and a fixing part 103. The mass part 101 is connected to the fixing part 103 through the elastic part 102, and the mass part 101 may vibrate relative to the fixing part 103. In some embodiments, the mass part 101 may be physically connected to the fixing part 103 through the elastic part 102, and the physical connection described in the present disclosure may include a welding, a clamping, a gluing, an integral molding, or the like, or any combination thereof. In some embodiments, when the mass part 101 contacts or couples with an external vibration unit (e.g., a bone conduction earphone, an air conduction earphone, a hearing aid, etc.), the mass part 101 receives the vibration of the vibration unit and moves relative to the fixing part 103. In some embodiments, the mass part 101 may be in a direct contact with or coupled to the vibration unit, and the vibration unit directly pushes the mass part 101 to move when it vibrates. In some embodiments, the mass part 101 may be in contact with or coupled to the vibration unit through other structures or parts (e.g., a protective film, etc.), and the mass part 101 receives the vibration of the vibration unit and moves.

The mass part 101 refers to an object with a certain weight. In the impedance device 100, the mass part 101 may be configured to represent a mass load fed back to the vibration unit near the tragus area of the head (e.g., facial area in front of the auricle), and the mass part 101 may be also referred to as an inertial part. When the vibration unit is connected to the mass part 101, the vibration unit pushes the mass part 101 to move together during the vibration process. At this time, the mass part 101 and the vibration unit maintain the same phase and have the same or approximately the same vibration acceleration. In some embodiments, a shape of the mass part 101 may include, but not limited to, a regular structure or an irregular structure such as a cylinder, a cuboid, a cone, a truncated cone, and a sphere. In some embodiments, a material of the mass part 101 may include, but not limited to, any material such as a plastic, a silica gel, a wood, a metal, a foam, etc.

The elastic part 102 is configured to provide a certain elasticity for a movement of the mass part 101. An elastic force of the elastic part 102 is proportional to a movement displacement or a movement range of the mass part 101. For example, the elastic part 102 is deformed during the movement of the mass part, and the elastic force of the elastic part 102 is related to a deformation amount of the elastic part 102, the greater the deformation amount is, the greater the elastic force provided by the elastic part 102 is. The elastic coefficient of the elastic part 102 may be configured to represent an equivalent elastic coefficient near the tragus area of the human head. In some embodiments, the elastic coefficient of the elastic part 102 may be adjusted to be approximately equal to the equivalent elastic coefficient near the tragus area of the human head (the facial area in front of the auricle). In some embodiments, the elastic coefficient of the elastic part 102 may be adjusted based on a hardness near the tragus area of the human head, different age groups of the wearer, a pressure when wearing the vibration unit, or a cell type at the position. The specific reasons are as follows. The hardnesses of different parts of the human head are different, and the equivalent elastic coefficients of different parts of the human head are also different. For example, a forehead and a mastoid behind the ear of the human head have relatively high hardness, and their equivalent elastic coefficients are relatively great. As another example, a temporal bone in front of the ear of the human head (that is, near the tragus area) is softer than the forehead and the mastoid behind the ear, and its equivalent elastic coefficient is relatively small. In addition, Young's modulus of elastin and collagen in different cells of the human head are different (e.g., the Young's modulus of the elastin E≈0.3 MPa, the Young's modulus of the collagen E=100~1000 MPa). Therefore, different cells have different impacts on the equivalent elastic coefficients of different areas of the human head. In addition, the equivalent elastic coefficients of the same part of the same person at different ages may also be different. For example, after the human body ages, the equivalent elastic coefficient may increase accordingly due to a decrease of an amount of subcutaneous fluid. In some embodiments, the equivalent elastic coefficient of the human head skin is further related to a pressure between the vibration unit and the head skin when the user wears the vibration unit. For example, when a user wears a device containing the vibration unit (e.g., a hearing device, an audio device, etc.), there is a pressure between the device and the skin of the human head, and the device squeezes subcutaneous cells of the human body, which affects the amount of subcutaneous fluid corresponding to the device. The greater the pressure is, the less the amount of subcutaneous fluid corresponding to the device is, and the corresponding equivalent elastic coefficient increases. To simulate the feature that the equivalent elastic coefficient of the human head skin changes with the pressure, in some embodiments, the elastic coefficient of the elastic part 102 may be set to change with the movement displacement or a movement amplitude of the mass part 101, for example, as a movement range of the mass part 101 increases, the elastic coefficient of the elastic part 102 also increases correspondingly. In some embodiments, the elastic part 102 may include, but not limited to, a spring, an elastic soft rubber or silicone, a plastic with elastic structure, a metal with elastic structures, etc., or other elastic forms (e.g., an air cushion, a membranous structure, etc.). In some embodiments, the spring includes, but is not limited to, one or more of a compression spring, a tension spring, a torsion spring, a coil spring, or a leaf spring. In some embodiments, the elastic part 102 may further be fluid (e.g., a gas, a liquid, or a combination of the gas and the liquid, etc.), when the shape of the fluid is subjected to the action of an external force (e.g., the pressure on the fluid when the mass part 101 vibrates), the fluid produces a certain movement resistance (i.e., viscosity) to the mass part 101, thereby providing a certain elasticity for the movement of the mass part 101.

The fixing part 103 refers to a carrier of the impedance device 100, which is configured to carry other parts of the impedance device 100 (e.g., the mass part 101, the elastic part 102, or a damping structure 104). In some embodiments, the structure of the fixing part 103 may include but not limited to a plate structure, a shell structure, a block structure, a mesa structure, etc. It should be noted that the fixing part 103 is not limited to the above-mentioned structure, and it may be a structure of any shape, as long as it is capable of carrying other parts of the impedance device 100 (e.g., the mass part 101, the elastic part 102, the damping structure 104), no further limitation is made here.

In some embodiments, the impedance device 100 may further include a damping structure 104. The damping structure 104 may be configured to provide a damping to the movement of the mass part 101. The damping structure 104 may represent an equivalent damping of the human body. In some embodiments, the damping structure 104 may include, but is not limited to, any one or combination of a spring damper, a hydraulic damper, a friction damper, a pulsation damper, a rotational damper, a viscous damper, an airflow damper, a damping hinge, a damping slide, an electromagnetic damping, etc. In some embodiments, the damping structure 104 may further be implemented by using features (e.g., liquid with a certain viscosity, such as magnetic fluid, etc.) of certain media (e.g., fluid, flexible material with pores).

To make the features of the impedance device 100 similar to the features near the tragus area of the human head, so that the impedance device 100 provides a mechanical impedance close to the tragus area of the human head, and further make a frequency response curve when the vibration unit is coupled with the impedance device is the same or approximately the same with the frequency response curve of the vibration unit when the vibration unit is worn near the tragus area of the human body, the mass of the mass part 101 or the elastic coefficient of the elastic part 102 may be adjusted. In some embodiments, the mass of the mass part 101 may be in a range of 0.5 g to 5 g. Preferably, the mass of the mass part 101 may be in a range of 0.6 g to 4.5 g. More preferably, the mass of the mass part 101 may be in a range of 0.8 g to 4 g. More preferably, the mass of the mass part 101 may be in a range of 1 g to 3.6 g. More preferably, the mass of the mass part 101 may be in a range of 1.5 g to 3 g. More preferably, the mass of the mass part 101 may be in a range of 2 g to 2.5 g. In some embodiments, the elastic coefficient of the elastic part 102 in the vibration direction in which the mass part 101 vibrates relative to the fixing part 103 may be in a range of 600 N/m to 5000 N/m. Preferably, the elastic coefficient of the elastic part 102 may be in a range of 700 N/m to 4500 N/m. More preferably, the elastic coefficient of the elastic part 102 may be in a range of 800 N/m to 4000 N/m. Preferably, the elastic coefficient of the elastic part 102 may be in a range of 850 N/m to 3500 N/m. Preferably, the elastic coefficient of the elastic part 102 may be in a range of 900 N/m to 1700 N/m. Preferably, the elastic coefficient of the elastic part 102 may be in a range of 1000 N/m to 1500 N/m. Preferably, the elastic coefficient of the elastic part 102 may be in a range of 1100 N/m to 1400 N/m.

In addition to the above manners of adjusting the mass of the mass part 101 and the elastic coefficient of the elastic part 102, in some embodiments, the damping of the damping structure 104 may further be adjusted so that the feature of the impedance device 100 may be similar to the feature of the tragus area of the human head. In some embodiments, the damping of the damping structure 104 may be in a range of 1 to 4. More preferably, the damping of the damping structure 104 may be in a range of 1 to 3. More preferably, the damping of the damping structure 104 may be in a range of 1 to 2. It should be noted that, in some embodiments, the mass part 101 or the elastic part 102 may further play a role in providing the damping, and here the damping provided by the mass part 101, the elastic part 102 or the damping structure 104 are regarded as the equivalent damping, the equivalent damping also satisfies the aforementioned range.

In some embodiments, one of the mass part 101, the elastic part 102, and the damping structure 104 may simultaneously provide two or three of a mass action, an elastic action, or a damping action. In some embodiments, the mass part 101 and the elastic part 102 may be provided by the same part. For example, an elastic silicone block may serve as the mass part 101 and the elastic part 102 at the same time. In some embodiments, the mass part 101 and the damping structure 104 may be provided by the same part. For example, the fixing part 103 has an opening with the same shape as the mass part 101. When a side wall of the mass part 101 is in contact with an inner wall of the fixing part 103, a frictional force between the mass part 101 and the fixing part 103 may be taken as the damping of the impedance device 100. In some embodiments, the elastic part 102 and the damping structure 104 may be provided by the same part. For example, a spring filled or wrapped with foam may serve as both the elastic part 102 and the damping structure 104.

It should be noted that the above descriptions about the impedance device 100 are only for illustration and description, and does not limit the scope of application of the present disclosure. For those skilled in the art, various modifications and changes may be made to the impedance device 100 under the guidance of the present disclosure, for example, the elastic part 102 or the damping structure 104 may be omitted. As another example, a number of the damping structure 104 is not limited to one, which can be two, three or more. Such modifications and changes are still within the scope of the present disclosure.

Figure 2:
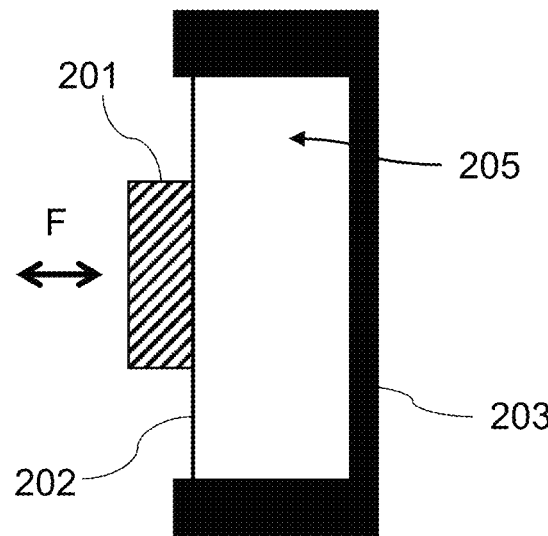
FIG. 2 is a schematic structural diagram illustrating an impedance device according to some embodiments of the present disclosure.

FIG. 2 is a schematic structural diagram illustrating an impedance device according to some embodiments of the present disclosure. As shown in FIG. 2, in some embodiments, an impedance device 200 may include a mass part 201, an elastic part 202, and a fixing part 203. The mass part 201 is connected to the fixing part 203 through the elastic part 202, and the mass part 201 may vibrate relative to the fixing part 203. In some embodiments, the fixing part 203 may be a cuboid, a cylinder, a terraced structure, a triangular prism, a spherical or hemispherical structure, or other regular or irregular structures. In some embodiments, the fixing part 203 may be a hollow structure with an open exposure (also referred to as an opening), and the elastic part 202 is located at the opening of the fixing part 203 to form a cavity 205 with the fixing part 203. In some embodiments, the cavity 205 may be a closed cavity. For example, in some embodiments, the elastic part 202 may be a membranous structure, the shape and a size of the membranous structure are approximately the same as the shape and the size of the opening of the fixing part 203, and the elastic part 202 may connect with a side wall of the fixing part 203 through its peripheral side to form the closed cavity 205. As another example, in some embodiments, the size of the membranous structure is greater than or equal to the size of the opening of the fixing part 203, and the membranous structure is located at one end of the fixing part 203 with the opening to cover the opening. In some embodiments, the material of the membranous structure may be an elastic silica gel, a rubber, etc. In some embodiments, the cavity 205 may further communicate with the outside world. For example, the membranous structure includes a hole (not shown in FIG. 2), and the cavity 205 communicates with the outside through the hole. As another example, the shape and the size of the membranous structure do not match the shape and the size of the opening of the fixing part 203, and a peripheral part of the membranous structure is connected to the side wall of the fixing part 203. In some embodiments, the elastic part 202 may further be a reed structure, which is connected to the side wall of the fixing part 203 through its peripheral side, and the reed structure may completely or partially cover the opening area. In some embodiments, the material of the reed structure may include a metal (e.g., a stainless steel, a beryllium copper, etc.), a plastic, etc.

In some embodiments, a gas in the cavity 205 may further provide the elasticity and the damping. For example, in the sealed cavity 205 formed by the elastic part 202 and the fixing part 203, the gas in the cavity 205 has the features of compressibility and expandability. When the mass part 201 moves toward the fixing part 203, the elastic part 202 deforms to cause the volume of the cavity 205 to become smaller, the pressure inside the cavity 205 increases, and the gas inside the cavity 205 generates a force on the elastic part 202 and the mass part 201, and the direction of the force is opposite to the movement direction of the mass part 201. When the mass part 201 moves away from the fixing part 203, it is opposite to the above situation. It can be seen that the gas in the cavity 205 may provide the elasticity. In some embodiments, the cavity 205 may further be filled with a liquid with a certain viscosity, such as one or more of a magnetic fluid, a water, an oily organic matter, etc., or the cavity 205 may be filled with both the liquid and the gas.

When an external force F (e.g., the force generated when the vibration unit vibrates) acts on the mass part 201, the mass part 201 vibrates relative to the fixing part 203 under the elastic action of the elastic part 202, and the vibration has different frequency responses under different frequencies. The vibration produces a resonance peak within a first specified frequency range. In some embodiments, the first specific frequency band range may be from 20 Hz to 300 Hz. In some embodiments, the first specific frequency band range may be 40 Hz-60 Hz.

Figure 3A:
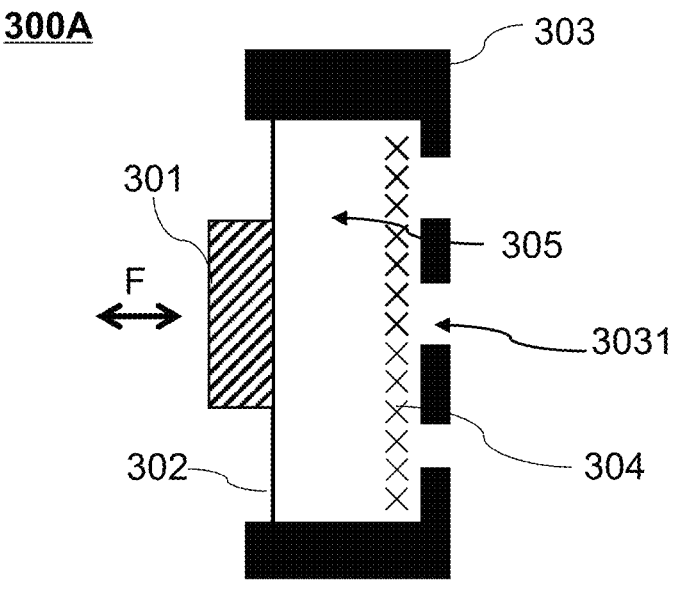
FIG. 3A is a schematic structural diagram illustrating an impedance device according to some embodiments of the present disclosure.

FIG. 3A is a schematic structural diagram illustrating an impedance device according to some embodiments of the present disclosure. As shown in FIG. 3A, in some embodiments, an impedance device 300A may include a mass part 301, an elastic part 302, and a fixing part 303. The mass part 301 may be connected to the fixing part 303 through the elastic part 302, and the mass part 301 may vibrate relative to the fixing part 303. In some embodiments, the fixing part 303 may be a hollow structure with an opening, and the elastic part 302 is located at the opening of the fixing part 303 to form a cavity 305 with the fixing part 303. In some embodiments, one or more holes 3031 are set on the side wall of the fixing part 303 opposite to the mass part 301 to communicate the air inside the cavity 305 with the air outside the cavity 305. In some embodiments, the impedance device 300A may further include an acoustic gauze 304 covering the one or more holes 3031, and the acoustic gauze 304 enables the air inside the cavity 305 to communicate with the air outside the cavity 305. Under an action of an external force (arrow F shown in FIG. 3A), the mass part 301 vibrates relative to the fixing part 303. When the mass part 301 generates a movement displacement relative to the fixing part 303 and acts on the elastic part 302, the elastic part 302 generates an elastic deformation, so that the pressure inside the cavity 305 increases, and the air inside the cavity 305 leaks to the external environment through the one or more holes 3031. When the air passes through the acoustic gauze 304, the airflow is subject to a viscous action, thus providing a damping for the movement of the mass part 301. It should be noted that, the cavity 305 and the air inside it, as well as the acoustic gauze 304 may be regarded as the damping structure of the impedance device 300A, so as to provide the damping for the movement of the mass part 301. In some embodiments, the damping of the impedance device 300A may be adjusted by adjusting sizes of the one or more holes 3031, a volume of the cavity, or an acoustic range of the acoustic gauze 304. To make the damping provided by the impedance device 300A approximately equal to the damping of a front face area of an auricle of a human body (e.g., the damping is in a range of 1 to 4), in some embodiments, a total area of the one or more holes 3031 occupies 10% to 90% of the area of side wall of the fixing part 303 where the one or more holes 3031 locate, the volume of the cavity is not more than 1000 cm$^3$, and the acoustic resistance of the acoustic gauze 304 may be in a range of 500 Rayl to 1600 Rayl. Preferably, the total area of the one or more holes 3031 occupies 20% to 80% of the area of side wall of the fixing part 303 where the one or more holes 3031 locate, the volume of the cavity is not more than 800 cm³, and the acoustic resistance of the acoustic gauze 304 may be in a range of 600 Rayl to 1400 Rayl. Further preferably, the total area of the one or more holes 3031 occupies 30% to 60% of the area of side wall of the fixing part 303 where the one or more holes 3031 locate, the volume of the cavity is not more than 600 cm³, and the acoustic resistance of the acoustic gauze 304 may be in a range of 800 Rayl to 1200 Rayl.

In some embodiments, the elastic part 302 may simultaneously provide an elastic support and damping functions. For example, in some embodiments, the elastic part 302 may be other structures (e.g., a membranous structure, a rod structure, or a block-like structure made of a flexible material) of any shape capable of carrying the mass part 301 and connecting the fixing part 303. In some embodiments, the flexible material may include but not limited to any one or more of a silicone, a rubber, polyvinyl alcohol (PVA), polyester (PET), polyimide (PI), polyethylene naphthalate (PEN), a textile material, etc. Under the action of an external force (arrow F shown in FIG. 3A), the mass part 301 vibrates relative to the fixing part 303. When the mass part 301 generates a movement displacement relative to the fixing part 303 and acts on the elastic part 302, the elastic part 302 generates an elastic deformation, so that an internal friction of the elastic part 302 generates a heat energy, thereby providing the damping for the movement of the mass part 301.

To make the elasticity provided by the impedance device 300A the same or approximately the same with the elasticity near the tragus area of the human body, in some embodiments, the elastic coefficient of the elastic part 302 in the vibration direction in which the mass part 301 vibrates relative to the fixing part 303 may be in a range of 600 N/m to 5000 N/m. Preferably, the elastic coefficient of the elastic part 302 in the vibration direction in which the mass part 301 vibrates relative to the fixing part 303 may be in a range of 700 N/m to 3500 N/m. Further preferably, the elastic coefficient of the elastic part 302 in the vibration direction in which the mass part 301 vibrates relative to the fixing part 303 may be in a range of 900 N/m to 1700 N/m.

It should be noted that when the elastic part 302 is a structure made of the flexible material, the elastic part 302 itself may provide the elasticity and the damping effect at the same time, and the side wall opposite to the mass part 301 of the fixing part 303 may not be additionally provided with the damping structure (e.g., the one or more holes 3031 and the acoustic gauze 304), or may further be provided with the damping structure at the same time. At this time, the elastic part 302 and the damping structure together provide the damping for the movement of the mass part 301. In addition, the elastic part 302 made of the flexible material may further be applied to the impedance device provided in other embodiments of the present disclosure, for example, the impedance device 300B shown in FIG. 3B, the impedance device 300C shown in FIG. 3C, and the impedance device 300C shown in FIG. 3D, the impedance device 300D shown in FIG. 4, the impedance device 400 shown in FIG. 4, and the impedance device 500 shown in FIG. 5.

It should be noted that the above description about the impedance device 300A is only for illustration and description, and does not limit the scope of application of the present disclosure. For those skilled in the art, under the guidance of the present disclosure, various modifications and changes can be made to the impedance device 300A. For example, the one or more holes 3031 and the acoustic gauze 304 may further be located at the side wall, or, in the impedance device 300B shown in FIG. 3B, the one or more holes 3031 and the acoustic gauze 304 may further be provided on the side wall of the fixing part 303 connecting the elastic part 302, and on the side wall of the fixing part 303 opposite to the mass part 301. Such modifications and changes remain within the scope of the present disclosure.

Figure 3B:
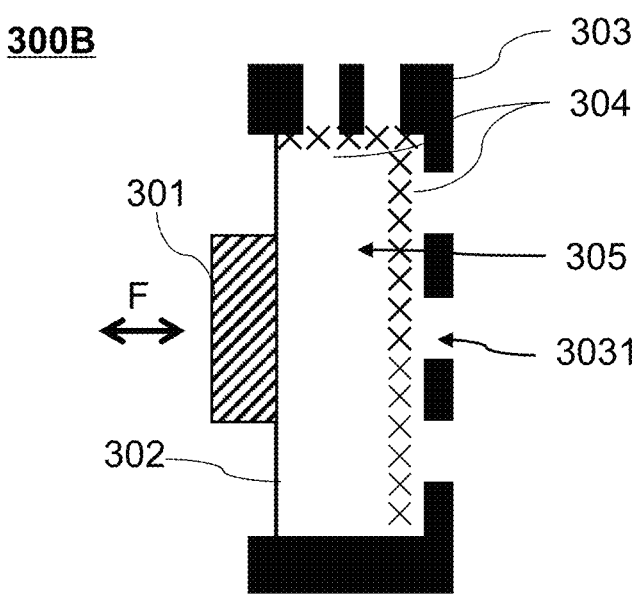
FIG. 3B is a schematic structural diagram illustrating an impedance device according to some other embodiments of the present disclosure.
Figure 3C:
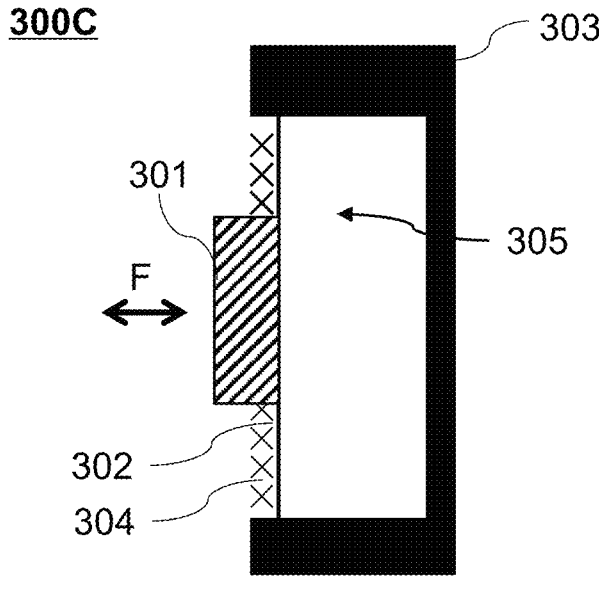
FIG. 3C is a schematic structural diagram of an impedance device according to some other embodiments of the present disclosure.

FIG. 3C is a schematic structural diagram of an impedance device according to some other embodiments of the present disclosure. An impedance device 300C shown in FIG. 3C is substantially the same as the impedance device 300A shown in FIG. 3A, a main difference being that the cavity 305 of the impedance device 300C communicates with the outside through the elastic part 302. In some embodiments, the elastic part 302 may be a reed structure, and the reed structure covers an opening of the fixing part 303 and forms a cavity 305. In some embodiments, the reed structure may include a hollow area (not shown in FIG. 3C) that enables air inside the cavity 305 to communicate with the air outside the cavity 305. In some embodiments, the hollow area may be covered with the acoustic gauze 304, which enables the air inside the cavity 305 to communicate with the air outside the cavity 305 and provides a damping. In some embodiments, the elastic part 302 may be a membranous structure, one or more holes are set on the membranous structure, and the one or more holes enable the air inside the cavity 305 to communicate with the air outside the cavity 305. In some embodiments, the one or more holes may be covered with the acoustic gauze 304, and the acoustic gauze 304 enables the air inside the cavity 305 to communicate with the air outside the cavity 305 and provides the damping.

Figure 3D:
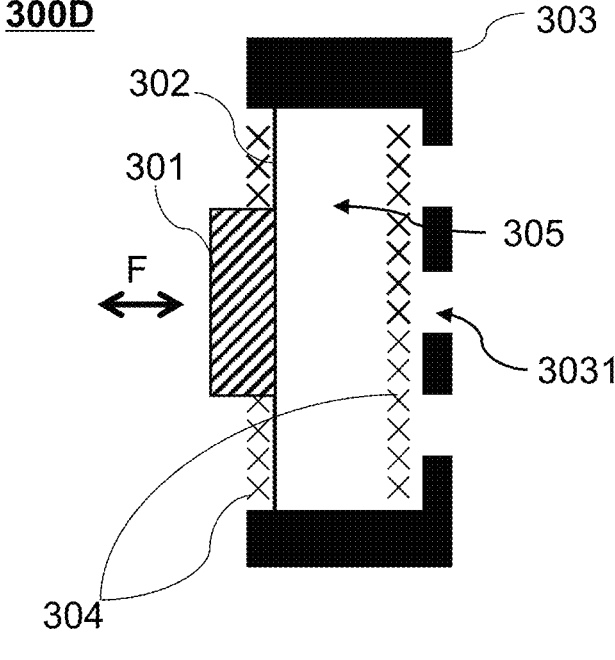
FIG. 3D is a schematic structural diagram illustrating an impedance device according to some other embodiments of the present disclosure.

FIG. 3D is a schematic structural diagram illustrating an impedance device according to some other embodiments of the present disclosure. An impedance device 300D shown in FIG. 3D is similar in structure to the impedance device 300A shown in FIG. 3A, the impedance device 300B shown in FIG. 3B, and the impedance device 300C shown in FIG. 3C. In the impedance device 300D, the fixing part 303 and the elastic part 302 are provided with damping structures. As shown in FIG. 3D, in some embodiments, one or more holes 3031 are provided on a side wall of the fixing part 303 opposite to the mass part 301 to communicate air inside the cavity 305 from the air outside the cavity 305. In some embodiments, the impedance device 300 D may further include an acoustic gauze 304 covering the one or more holes 3031, which enables the air inside the cavity 305 to communicate with the air outside the cavity 305. In some embodiments, the elastic part 302 has a hollow area or a hole, and the hollow area or the hole is covered with the acoustic gauze 304, the acoustic gauze 304 enables the air inside the cavity 305 to communicate with the air outside the cavity 305, and provides a damping.

Figure 4:
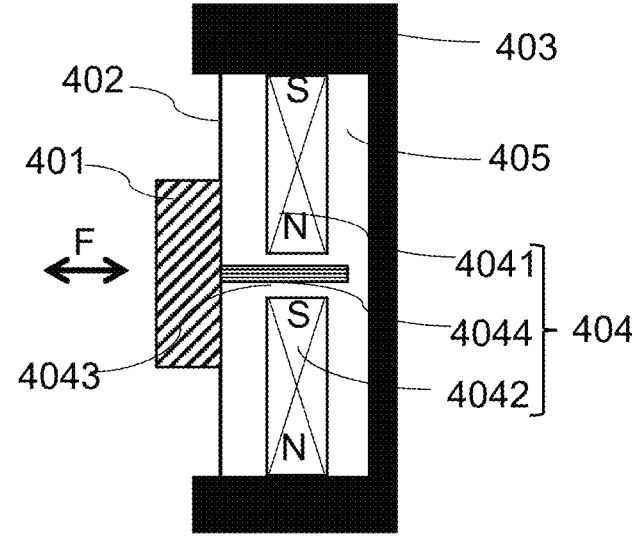
FIG. 4 is a schematic structural diagram illustrating an impedance device according to some embodiments of the present disclosure.

FIG. 4 is a schematic structural diagram illustrating an impedance device according to some embodiments of the present disclosure. As shown in FIG. 4, an impedance device 400 may include a mass part 401, an elastic part 402, and a fixing part 403. The mass part 401 is connected to the fixing part 403 through the elastic part 402, and the mass part 401 may vibrate relative to the fixing part 403. In some embodiments, the fixing part 403 may be a structure with a groove 405, and the elastic part 402 is located at the groove 405 of the fixing part 403 and connected to the fixing part 403 through the elastic part 402. In some embodiments, the elastic part 402 may be a membranous structure, a rod-like structure, a sheet-like structure, etc. In some embodiments, the impedance device 400 may further include a magnetic circuit structure, and the magnetic circuit structure may be located between the elastic part 402 and the fixing part 403.

In some embodiments, the magnetic circuit structure may include a first magnet 4041 and a second magnet 4042 arranged at intervals in the groove 405, one pole of the first magnet 4041 and one pole of the second magnet 4042 are opposite to each other to form a magnetic gap 4043. In addition, the other pole of the first magnet 4041 and the other pole of the second magnet 4042 are connected to the fixing part 403. In some embodiments, the impedance device 400 may further include a metal sheet 4044, one end of the metal sheet 4044 is connected to the mass part 401 or the elastic part 402, and the other end of the metal sheet 4044 extends to a side away from the mass part 401 or the elastic part 402, and extends into the magnetic gap 4043. Under an action of an external force (arrow F shown in FIG. 4), the mass part 401 vibrates relative to the fixing part 403. When the mass part 401 generates a movement displacement relative to the fixing part 403, and drives the metal sheet 4044 to perform a movement to cut magnetic lines in the magnetic gap 4043, so that the metal sheet 4044 generates eddy currents. According to Lenz's law, the metal sheet 4044 produces an action force opposite to the displacement direction of the mass part 401 when it is moving to cut the magnetic lines. The action force acts on the mass part 401 to provide a damping for the movement of the mass part 401. It should be noted that here the magnetic circuit structure and the metal sheet 4044 are the damping structure 404 of the impedance device 400, providing the damping for the movement of the mass part 401.

In some embodiments, through adjusting factors like a conductivity of the metal sheet 4044, a projection area of the metal sheet 4044 on the magnetic circuit structure, a magnetic flux range of the magnetic circuit structure, etc., a damping value provided by the damping structure 404 may be within a specific range (e.g., 1-4). In some embodiments, the metal sheet 4044 may be made of a high-conductivity metal. For example, the material of the metal sheet 4044 may include, but not limited to, a copper, an aluminum, a silver, a gold, a platinum, etc. It should be noted that, in some embodiments, the metal sheet 4044 may further be replaced with a structure made of other non-metallic materials with conductive lines, such as one or more of graphite, semiconductor materials (such as a selenium, a silicon, a germanium, a silicon carbide, a Gallium arsenide, etc.) etc. In some embodiments, the metal sheet 4044 may further be replaced by a structure made of a mixture of the non-metallic materials and the metal materials. To make the damping value provided by the damping structure 404 within a specific range (e.g., 1-4), in some embodiments, along the vibration direction of the mass part 401 relative to the fixing part 403, the projection area of the metal sheet 4044 on the magnetic circuit structure (e.g., a pole of the first magnet 4041 opposite to the second magnet 4042) is in a range of 25 mm$^2$~400 mm$^2$, the magnetic flux of the magnetic circuit structure is in a range of 0.2 T~1.8 T, and a resistivity of the metal sheet 1044 is in a range of 0.8×10$^{-8}$ Ω·m to 2.0×10$^{-8}$ Ω·m. Preferably, along the vibration direction of the mass part 401 relative to the fixing part 403, the projection area of the metal sheet 4044 on the magnetic circuit structure is in a range of 50 mm$^2$~200 mm$^2$, the magnetic flux of the magnetic circuit structure is in a range of 0.8 T~1.5 T, and the resistivity of the metal sheet 1044 is in a range of 1.2×10$^{-8}$ Ω·m to 2.0×10$^{-8}$ Ω·m.

It should be noted that the above description about the impedance device 400 is only for illustration and description, and does not limit the scope of application of the present disclosure. For those skilled in the art, various modifications and changes can be made to the impedance device 400 under the guidance of the present disclosure. For example, the magnets of the magnetic circuit structure are not limited to the above-mentioned first magnet 4041 and second magnet 4042, and may also include other magnets, meanwhile, such modifications and changes remain within the scope of the present disclosure. In addition, the impedance device 400 may further be provided with the damping structures shown in FIGS. 3A-3D at the same time.

Figure 5:
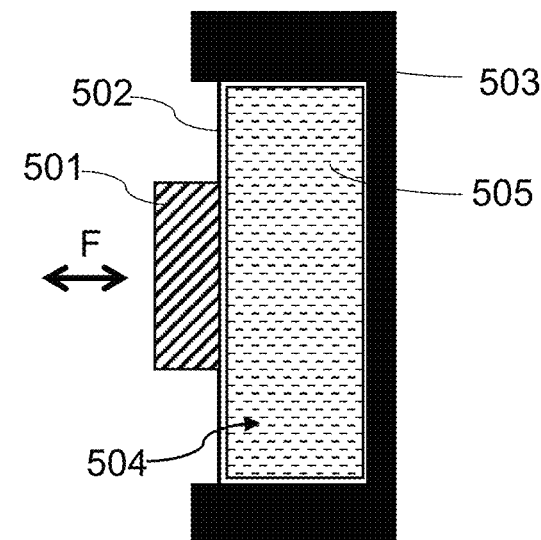
FIG. 5 is a schematic structural diagram illustrating an impedance device according to some embodiments of the present disclosure.

FIG. 5 is a schematic structural diagram illustrating an impedance device according to some embodiments of the present disclosure. As shown in FIG. 5, an overall structure of an impedance device 500 shown in FIG. 5 is substantially the same as that of the impedance device 200 shown in FIG. 2. A mass part 501, an elastic part 502, a fixing part 503, and a cavity 505 are respectively similar to the mass part 201, the elastic part 202, the fixing part 203, and the cavity 205 in FIG. 2, which will not be repeated here.

As shown in FIG. 5, in some embodiments, the cavity 505 is filled with a flexible structure 504, and the flexible structure 504 is in contact with the elastic part 502 and the fixing part 503, respectively. The flexible structure 504 has an elasticity. When the mass part 501 generates a movement displacement, the elastic part 502 undergoes an elastic deformation, and the elastic part 502 acts on the flexible structure 504 at the same time. The flexible structure 504 has a certain elasticity, which can absorb a part of the vibration of the mass part 501 and play a role of a damping. In some embodiments, a material of the flexible structure may include, but not limited to, a silicone, a rubber, a polyvinyl alcohol (PVA), a polyester (PET), a polyimide (PI), a polyethylene naphthalate (PEN), or a textile material. In some embodiments, the flexible structure 504 has a porous structure, such as a compressed foam. The elastic part 502 undergoes the elastic deformation and acts on the flexible structure 504, an airflow in the cavity 505 spreads in the porous pores of the flexible structure 504, and the airflow receives a viscous effect, thereby providing the damping for the movement of the mass part 501. It should be noted that the flexible structure here is the damping structure of the impedance device 500. To make the damping provided by the impedance device 500 similar to the damping of a facial area near the front of the auricle of the human body, in some embodiments, a hardness of the flexible structure 504 may be in a range of 5 degrees to 45 degrees, and a density of the flexible structure 504 may be in a range of 40 kg/m3 to 120 kg/m3. Preferably, the hardness of the flexible structure 504 may be in a range of 12 degrees to 35 degrees, and the density of the flexible structure 504 may be in a range of 60 kg/m3 to 100 kg/m3.

Figure 6:
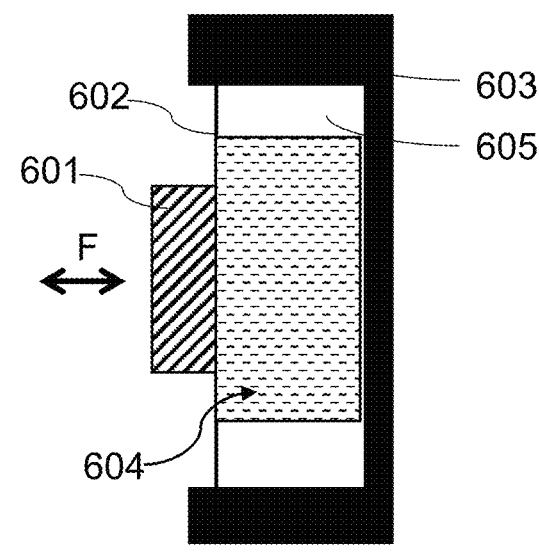
FIG. 6 is a schematic structural diagram illustrating an impedance device according to some embodiments of the present disclosure.

FIG. 6 is a schematic structural diagram of an impedance device provided according to some embodiments of the present disclosure. As shown in FIG. 6, an overall structure of the impedance device 600 shown in FIG. 6 is substantially the same as that of the impedance device 500 shown in FIG. 5. The structures of a mass part 601, an elastic part 602, and a fixing part 603 are similar to that of the mass part 501, an elastic part 502, and a fixing part 503, respectively. A difference between them lies that the flexible structure 604 fills a part of the cavity 605, and an area inside the cavity 605 that is not filled by the flexible structure 604 is air. It should be noted that the damping structures shown in FIGS. 3A-3D may further be applied to the impedance device 600 shown in FIG. 6. When there are a plurality of damping structures providing damping in the impedance device 600, a total damping of the impedance device 600 is an equivalent damping. In some embodiments, the equivalent damping may be in a range of 1-4. More preferably, the damping range of the equivalent damping may be in a range of 1 to 3. More preferably, the damping range of the equivalent damping may be in a range of 1 to 2.

Figure 7:
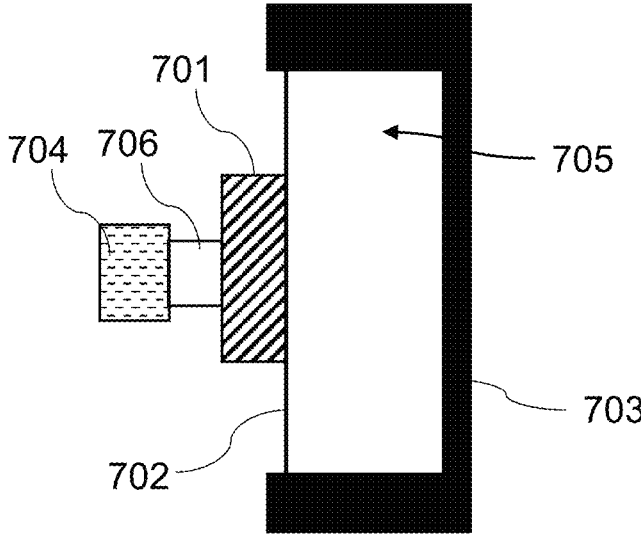
FIG. 7 is a schematic structural diagram illustrating an impedance device according to some embodiments of the present disclosure.

FIG. 7 is a schematic structural diagram illustrating an impedance device according to some embodiments of the present disclosure. An overall structure of the impedance device 700 shown in FIG. 7 is substantially the same as that of the impedance device 200 shown in FIG. 2. The structures of a mass part 701, an elastic part 702, and a fixing part 703 are similar to that of the mass part 201, an elastic part 202, and a fixing part 203, respectively, which will not be repeated here. A difference between the impedance device 700 and the impedance device 200 is that the impedance device 700 shown in FIG. 7 may include a damping structure 704 located on a side of the mass part 701 away from the elastic part 702 and is spaced apart from the mass part 701. In some embodiments, the damping structure 704 may be made of a flexible material. Exemplary flexible material may include but not limited to a silicone, a rubber, a polyvinyl alcohol (PVA), a polyester (PET), a polyimide (PI), a polyethylene naphthalate (PEN), a textile material, etc. In some implementations, the damping structure 704 has porous pores, e.g., a compressed foam. In some application scenarios, the vibration unit 706 may be located between the damping structure 704 and the mass part 701, the damping structure 704 may be directly fixedly connected to the fixing part 703, or the damping structure 704 may be fixed by a fastener (e.g., a support rod), so that the vibration unit 706 is fixed between the damping structure 704 and the mass part 701. As the damping structure 704 is fixed on one side of the mass part 701 and is in a direct contact with the vibration unit 706, when the vibration unit 706 vibrates, the damping structure 704 may absorb a vibration energy of the vibration unit 706 to provide a damping effect.

It should be noted that, in the above-mentioned imped-ance devices (e.g., the impedance devices 300A, 300B, 300C, 300D, 400, 500, 600, and 700), a single part may function as different parts at the same time. By way of illustration only, in some embodiments, a single part may function as both the mass part and the elastic part. For example, when the elastic part is a reed structure, a mass of the reed structure may be relatively great. At this time, the reed structure not only plays the role of providing elasticity for the elastic part, but also plays the role of providing the mass. When determining a mass value, a sum of the mass of the reed structure (e.g., 1/3 of the mass of the reed structure) and the mass of the mass part may be used to determine the mass value provided by the parts in the impedance device, and then more accurately determine the mass value provided by the parts in the impedance device. In some embodiments, a single part of the impedance device may function as both the elastic part and the damping structure. For example, when an acoustic gauze is used to provide an air damping, the air inside the cavity also provides an elasticity. When determining an elastic coefficient provided by the impedance device, it is necessary to combine the elastic coefficient of the elastic part with the elastic coefficient of the air inside the cavity and perform a serial calculation. It should be noted that the elastic coefficients involved in the embodiments of the present disclosure all refer to the elastic coefficients along the direction of an external force.

In some embodiments, a single part of the impedance device may function both as the mass part and as the damping structure. For example, when the foam is used as the mass part, the vibration unit pushes the mass part to move and displace, and at the same time the mass part is squeezed, and the internal porous pores may further play the damping effect. In some embodiments, a single part of the impedance device may simultaneously function as the mass part, the elastic part, and the damping structure. For example, when a silicon rubber diaphragm is used as the elastic part, the silicon rubber diaphragm provides the elastic force on the one hand, and an internal friction may further play a damping effect when the diaphragm moves. At the same time, a part of the mass of the diaphragm also needs to be included in an additional mass pf the mass part.

Figure 8:
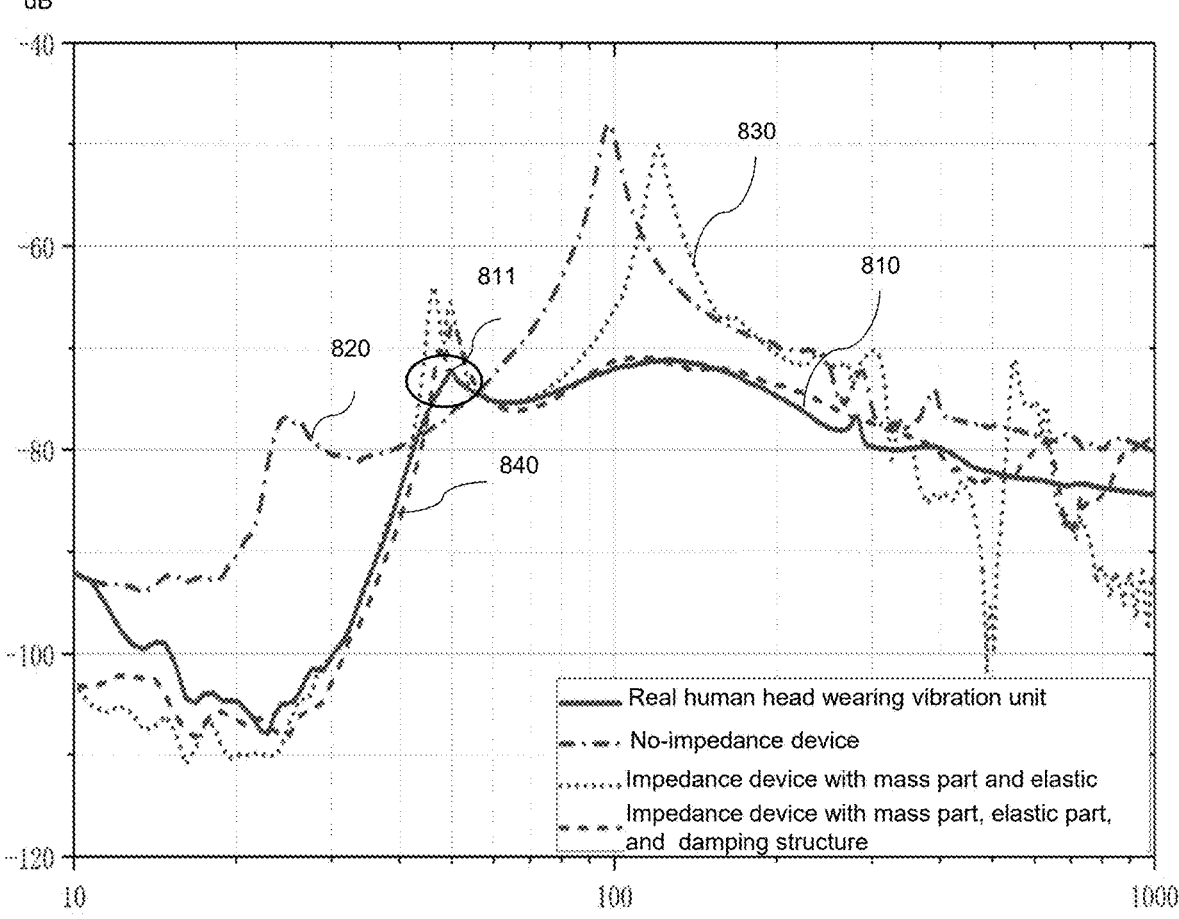
FIG. 8 illustrates a frequency response curve of a vibration of a vibration unit according to some embodiments of the present disclosure.

FIG. 8 illustrates a frequency response curve of a vibra-tion of a vibration unit according to some embodiments of the present disclosure. As shown in FIG. 8, an abscissa represents a frequency (Hz), and an ordinate represents a frequency response (dB) of the vibration unit. A frequency response curve 810 (the curve corresponding to a "real human head wearing vibration unit" shown in FIG. 8) represents a measured vibration frequency response curve after the vibration unit is coupled with an actual face tragus area. A frequency response curve 820 (the curve correspond-ing to a "no-impedance device" shown in FIG. 8) represents a measured frequency response curve of the vibration unit in a suspension state. A frequency response curve 830 (the curve corresponding to "impedance device with mass part and elastic part" shown in FIG. 8) represents a measured frequency response curve after the impedance device with-out a damping structure is coupled with the vibration unit. A frequency response curve 840 (the curve corresponding to "impedance device with mass part, elastic part, and damping structure" shown in FIG. 8) represents a measured frequency response curve after the impedance device with a damping structure is coupled with the vibration unit. As shown in FIG. 8, combining the frequency response curve 810 and the frequency response curve 820, it can be seen that there is indeed a significant difference between the frequency response curve of the vibration unit in a suspension state and the frequency response curve after the vibration unit is coupled with the actual face tragus area. Combining the frequency response curves 810, 820 and 830, in a range of 25 Hz~100 Hz, the frequency response after the impedance device without a damping structure is coupled with the vibration unit is basically consistent with the frequency response after the vibration unit is coupled with the actual face tragus area. At 200 Hz-1000 Hz, the difference between the frequency response after the impedance device with a damping structure is coupled with the vibration unit and the frequency response after the vibration unit is coupled with the actual face tragus area is small. It can be seen that the frequency response curves 810 and 840 are substantially identical. It can be seen from this that the impedance device described in the present disclosure basically matches the mechanical impedance of the actual human face, and can reflect the mechanical features of the actual human face.

In some embodiments, the impedance device may be adjusted by adjusting the mass of the impedance device, the elastic coefficient of the elastic part, or the damping of the damping structure, so that the mechanical impedance pro-vided by the impedance device is approximately consistent with the mechanical impedance near the tragus region of the head. The frequency response curve of the vibration unit when the vibration unit is worn near the tragus region of the head has a resonance peak 811 in a first specific frequency band range (e.g., 20 Hz-300 Hz), that is, a vibration force level of the vibration unit when the vibration unit is worn near the tragus region of the head has a maximum value (also called a peak) within the first specific frequency band range. When the frequency is greater than the first specific frequency band range, the vibration force level of the vibration unit when the vibration unit is worn near the tragus region of the head decreases as the frequency increases. In some embodiments, within the range greater than the resonance frequency corresponding to the resonance peak 811, the vibration force level of the vibration unit is in a range of −90 dB to −70 dB, and a difference between the vibration force level of the resonance peak 811 of the vibration unit and the vibration force level within the range greater than the resonance frequency corresponding to the resonance peak 811 is in a range of 10 dB to 20 dB.

The above FIG. 8 is described on the frequency response curve of the vibration unit. Here, from the mechanical impedance frequency response curve (not shown in the figure) near the tragus area of the human head, the mechanical impedance frequency response curve near the tragus area of the human head has a trough in a second specific frequency band range (e.g., 50 Hz-500 Hz), that is, the mechanical impedance near the tragus region of the head has a minimum value (also called a trough value) in a specific frequency band range. Wherein, the frequency corresponding to the trough is smaller than the frequency corresponding to the resonance peak. In addition, when the frequency is lower than the second specific frequency band range, the mechanical impedance near the tragus region of the head decreases with the increase of the frequency; when the frequency is greater than the second specific frequency band range, the mechanical impedance near the tragus region of the head increases with the increase of the frequency. In some embodiments, the second specific frequency band range is not limited to the above-mentioned 50 Hz-500 Hz. In some embodiments, the second specific frequency band range may also be other frequency ranges such as 60 Hz-400 Hz, 70 Hz-300 Hz, or 80 Hz-200 Hz, or any frequency value in this range.

In some embodiments, the damping of the impedance device can be adjusted so that the features of the mechanical impedance provided by the impedance device are consistent or approximately consistent with the features of the mechanical impedance near the tragus region of the head. Here, a trough value of a mechanical impedance provided by the impedance device is used as an example for illustration. In some embodiments, a damping of the damping structure may be adjusted to a range of 1 to 4, so that the trough value of the mechanical impedance of the impedance device is in a range of 0 dB to 15 dB. Preferably, the damping of the damping structure may be adjusted to be in a rage of 1.5 to 3.9, so that the trough value of the mechanical impedance of the impedance device is in a range of 2 dB to 13 dB. Further preferably, the damping of the damping structure may be adjusted to be in a range of 2 to 3.7, so that the trough value of the mechanical impedance of the impedance device is in a range of 3 dB to 12 dB. More preferably, the damping of the damping structure may be adjusted to be in a range of 2.4 to 3.2, so that the trough value of the mechanical impedance of the impedance device is in a range of 6 dB to 10 dB. In some embodiments, the mass of the mass part and the elastic coefficient of the elastic part may be adjusted so that the frequency corresponding to the trough value is within a specific frequency band range. In some embodiments, the range of the mass of the mass part may be adjusted to be in a range of 0.5 g~5 g, and the elastic coefficient of the elastic part may be in a range of 600 N/m~5000 N/m, so that the trough value of the impedance device may be in a range of 50 Hz-500 Hz. Preferably, the mass of the mass part may be adjusted to be in a range of 0.8 g to 4.5 g, and the elastic coefficient of the elastic part may be in a range of 700 N/m to 3500 N/m, so that the trough value of the impedance device may be in a range of 60 Hz to 320 Hz. More preferably, the mass of the mass part may be adjusted to be in a range of 1 g to 3.6 g, and the elastic coefficient of the elastic part may be in a range of 900 N/m to 1700 N/m, so that the trough value of the impedance device may be in a range of 80 Hz to 200 Hz.

Figure 9:
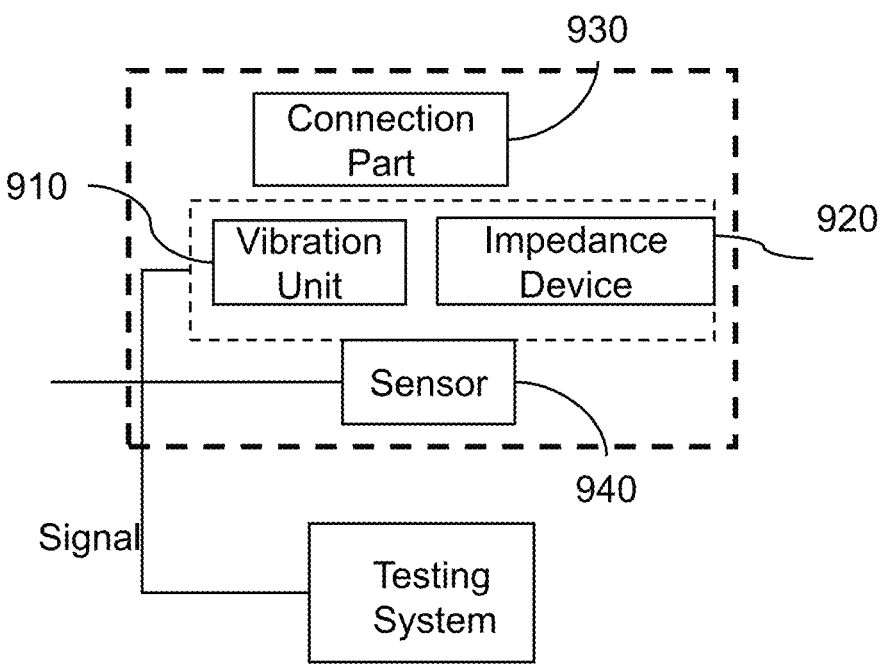
FIG. 9 is an exemplary frame diagram illustrating a system for simulating an impact of a head on a vibration of a vibration unit according to some embodiments of the present disclosure.

FIG. 9 is an exemplary frame diagram illustrating a system for simulating an impact of a head on a vibration of a vibration unit according to some embodiments of the present disclosure. As shown in FIG. 9, a system 900 may include a vibration unit 910, an impedance device 920, a connection part 930, and a sensor 940.

In some embodiments, the vibration unit 910 may be configured to provide a vibration signal. In some embodiments, the vibration unit 910 may convert a signal containing audio information into a vibration signal. In some embodiments, the audio information may include video and audio files in a specific data format, or data or files that can be converted into audio in a specific way, and the signal containing the audio information may come from a storage component that communicates with or is connected to the vibration unit 910. In some embodiments, the signal containing audio information may include an electrical signal, an optical signal, a magnetic signal, a mechanical signal, etc., or any combination thereof. In some embodiments, the vibration unit 910 may obtain the signal containing audio information in a variety of different ways, including but not limited to a wired or wireless acquisition, a real-time acquisition, or a delayed acquisition. For example, the vibration unit 910 may receive the electrical signal containing audio information in a wired or wireless manner, or may directly obtain data from a storage medium to generate the signal. In some embodiments, the vibration unit 910 may realize the conversion from the signal containing the audio information into a mechanical vibration. The conversion process may include a coexistence and conversion of various types of energy. For example, the electrical signal may be directly converted into the mechanical vibration and produces sound. As another example, the audio information may be included in the optical signal, and the process of converting the optical signal into the vibration signal may be implemented through a transducer. Other types of energy that can coexist and convert during the working process of the transducer include a thermal energy, a magnetic field energy, etc. In some embodiments, an energy conversion mode of the transducer may include a moving coil, an electrostatic, a piezoelectric, a moving iron, a pneumatic, an electromagnetic, etc., or any combination thereof.

In some embodiments, the impedance device 920 may contact the vibration unit 910 and provide a mechanical impedance to the vibration unit 910. In some embodiments, there is a certain pressure between the impedance device 920 and the vibration unit 910. The mechanical impedance provided by the impedance device 920 may simulate the impedance of the head relative to the vibration unit 910 in an actual use. A vibration state of the vibration unit 910 provided with the mechanical impedance is consistent or nearly consistent with vibration features when it is actually used on the head, so that the system may simulate the impact of the mechanical impedance of the head on the vibration state of the vibration unit 910 when the vibration unit 910 is coupled with head vibration. Descriptions regarding the impedance device may be found in FIGS. 1-7, which are not repeated here.

In some embodiments, the connection part 930 may be configured to couple the vibration unit 910 with the impedance device 920. In some embodiments, the connection part 930 may provide a pressure of 0.05 N-3.5 N for the vibration unit 910 and the impedance device 920. Preferably, the connection part 930 may provide the pressure of 0.1N-3N for the vibration unit 910 and the impedance device 920. Preferably, the connection part 930 may provide the pressure of 0.3 N-2.5 N for the vibration unit 910 and the impedance device 920. Preferably, the connection part 930 may provide the pressure of 0.5 N-2 N for the vibration unit 910 and the impedance device 920. Preferably, the connection part 930 may provide the pressure of 0.8 N-1.8 N for the vibration unit 910 and the impedance device 920. Preferably, the connection part 930 may provide the pressure of 1 N-1.5 N for the vibration unit 910 and the impedance device 920. In some embodiments, the connecting part 930 may be connected with the vibration unit 910 and apply the pressure to the vibration unit 910, so that the vibration unit 910 may be coupled with the impedance device 920, such as a support frame, etc. In some embodiments, the connection part 930 may be connected to the vibration unit 910 and fixedly contact other fixed structures. For example, the connection part 930 may bind the vibration unit 910 to other fixed structures. The other fixed structures include but are not limited to a head model or fixture, etc. In some embodiments, the connection part 930 may be integrally formed with the vibration unit 910, and may be fixedly contact other fixed structures such as an ear hook structure integrally formed with an earphone, an ear clamping structure integrally formed with a hearing aid, a glasses frame structure integrally formed with an audio glasses, etc. In some embodiments, the connection part 930 may be made of plastic or metal with certain hardness and shape. In some embodiments, the material of the connection part 930 may further be silicone, rubber, fabric, etc. with certain elasticity. In some embodiments, the material of the connection part 930 may further be foam, which provides the damping for the movement of the vibration unit 910.

In some embodiments, when the connection part 930 provides the vibration unit 910 and the impedance device 920 with a pressure of 0.05N~3.5N, the impedance device 920 provides the vibration unit 910 with a mechanical impedance in a range of 6 dB-50 dB. The mechanical impedance in the range of 6 dB~50 dB simulates the actual impedance fed back to the vibration unit 910 near the tragus area during the actual use, so that the vibration impact of the mechanical impedance on the vibration unit 910 when the vibration unit 910 is coupled with the impedance device 920 may simulate the vibration impact of a head actual impedance when the vibration unit 910 is coupled with the head. In this way, it is convenient for a testing or a calibration device of related products in development and production.

To ensure that the vibration unit 910 and the impedance device 920 are fully fitted, in some embodiments, an area of the coupling area between the impedance device 920 and the vibration unit 910 may be in a range of 0.25 cm² to 4 cm². In some embodiments, the area of the coupling area between the impedance device 920 and the vibration unit 910 may be in a range of 1 cm² to 3.6 cm². In some embodiments, the area of the coupling area between the impedance device 920 and the vibration unit 910 may be in a range of 1 cm² to 3.6 cm². In some embodiments, the area of the coupling area between the impedance device 920 and the vibration unit 910 may be in a range of 1 cm² to 3.6 cm². It should be noted that the area of the coupling area between the impedance device 920 and the vibration unit 910 is not limited to the above-mentioned range, and may further be in other ranges. For example, the area of the coupling area may be greater than 4 cm² or smaller than 0.25 cm², and the specific area of the coupling area may be adaptively adjusted according to a size of the vibration unit 910.

In some embodiments, the sensor 940 may be configured to collect parameter information of the vibration unit 910 during the vibration. In some embodiments, the sensor 940 may be further configured to collect the parameter information during a coupling vibration process of the vibration unit 910 and the impedance device 920. In some embodiments, the parameter information in the vibration process may be configured to represent the vibration impact of the vibration unit 910. In some embodiments, the parameter information in the vibration process may include vibration feature data, and the vibration feature data may include but not limited to one or more of a vibration displacement, a vibration velocity, a vibration acceleration, etc. In some embodiments, the parameter information in the vibration process may include air conduction acoustic feature data generated by the vibration, and the air conduction acoustic feature data may include but not limited to a sound pressure level or a frequency response of the air conduction sound. In some embodiments, the sensor 940 may be located at the vibration unit 910. For example, the sensor 940 may be directly installed on a surface or inside of the vibration unit 910. In some embodiments, the sensor 940 may be indirectly connected to the vibration unit 910. For example, the sensor 940 may be installed on the surface or inside of the impedance device 920. For example, the sensor 940 may be installed on the mass part of the impedance device 920. In some embodiments, the sensor 940 may further be located on the connection part 930. In some embodiments, the type and/or form of the sensor 940 may not be limited. For example, the sensor 940 may be a non-contact laser sensor (e.g., a vibrometer, a Doppler tester) or an air conduction speaker that can obtain a vibration acceleration (a velocity or displacement), or it may be various contact acceleration sensors, bone conduction sensors, piezoelectric sensors, MEMS sensors, etc.

In some embodiments, the system may further include a test system, and the test system may be connected to at least one sensor 940 to collect and/or process a detection signal of the at least one sensor 940. In some embodiments, the testing system may be connected to the vibration unit 910 to provide a driving signal to the vibration unit 910 to drive the vibration unit 910 to generate a mechanical vibration signal. In some embodiments, the test system is connected with the at least one sensor 940 and the vibration unit 910, drives the vibration unit 910 to generate the mechanical vibration signal, and collects and processes the signal collected by the at least one sensor 940.

It should be understood that the system for simulating the impact of the head on the vibration of the vibration unit 910 shown in FIG. 9 is only for example and description, and does not limit the scope of application of the present disclosure. For those skilled in the art, various corrections and changes may be made to the system under the guidance of the present disclosure. For example, a plurality of sensors 940 of different types or forms may be set to monitor more complete parameter information. As another example, the connection part 930 may be omitted and the vibration unit 910 and the impedance device 920 may be directly coupled through a magnetic attraction or adhesion, these modifications and changes are still within the scope of the present disclosure.

Figure 10:
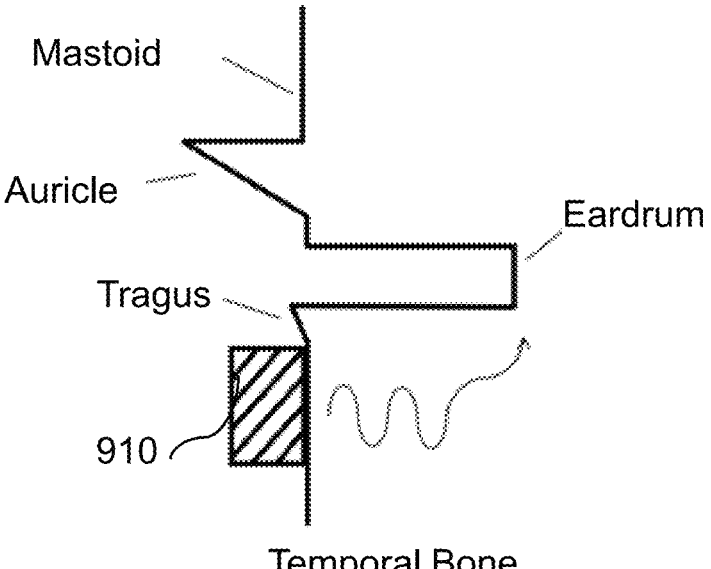
FIG. 10 is a diagram illustrating a position of a head coupling area simulated by an impedance device according to some embodiments of the present disclosure.

FIG. 10 is a diagram illustrating a position of a head coupling area simulated by an impedance device according to some embodiments of the present disclosure. As shown in FIG. 10, when the vibration unit 910 is coupled to the head, the vibration unit 910 is coupled to the front side of a tragus (near the tragus area) of a human body along a cross section viewed from the top of the head. In some embodiments, the vibration unit 910 directly transmits a vibration signal to an auditory ossicles of a middle ear and a cochlea of an inner ear, avoiding the tympanic membrane by mainly vibrating a temporal bone in front of the tragus. In some cases, the vibration of the vibration unit 910 may further drive a surrounding air to vibrate to generate a part of an air conduction sound, which is transmitted to the eardrum through an external auditory canal. The impedance device shown in some embodiments of the present disclosure is configured to simulate an actual impedance generated near the tragus area where the vibration unit 910 is coupled with the tragus area, and the system for simulating the impact of the head on the vibration of the vibration unit 910 is configured to simulate a vibration impact of an actual impedance near the tragus area on the vibration of the vibration unit 910 when the vibration unit 910 vibrates near the coupling tragus area. The coupling between the vibration unit 910 and a vicinity of the tragus area may meet application scenarios of most bone conduction earphones, and may further meet the application scenarios of some hearing aids. Therefore, the system for simulating the impact of the head on the vibration of the vibration unit 910 may objectively measure the vibration impact of the vibration unit 910, and simulate the actual frequency response of the vibration unit 910 when the vibration unit 910 vibrates near the coupling tragus area, which may be used as a testing or calibration device of related products in development and production.

Figure 11:
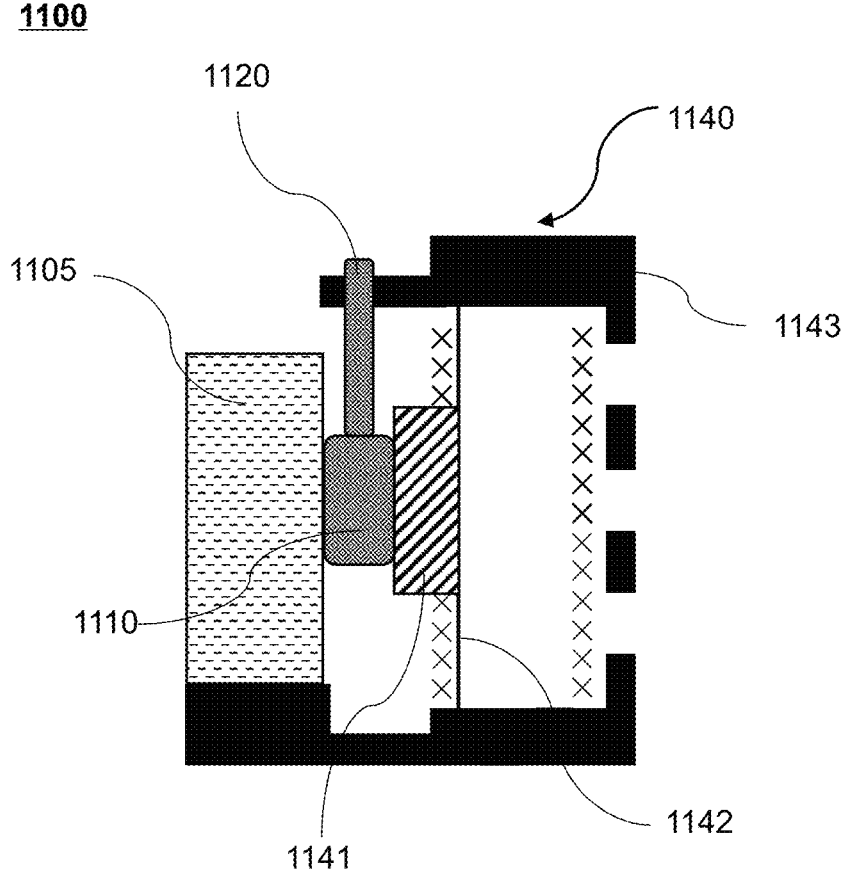
FIG. 11 is a schematic structural diagram illustrating a system for simulating an impact of a head on a vibration of a vibration unit according to some embodiments of the present disclosure.

FIG. 11 is a schematic structural diagram illustrating a system for simulating an impact of a head on a vibration of a vibration unit according to some embodiments of the present disclosure. A mass part 1141, an elastic part 1142, and a fixing part 1143 in FIG. 11 are similar to the mass part 301, the elastic part 302, and the fixing part 303 in FIG. 3D, which will not be repeated here. As shown in FIG. 11, a system 1100 may include a vibration unit 1110, a connection part 1120, and an impedance device 1140. The connection part 1120 may be fixedly arranged at the fixing part 1143 of the impedance device 1140, and one end of the connection part 1120 is connected to the vibration unit 1110. The connection part 1120 couples the vibration unit 1110 to the mass part 1141 of the impedance device 1140. At the same time, a force applied by the connection part 1120 on the vibration unit 1110 may provide a pressure for coupling the vibration unit 1110 and the impedance device 1140. In some embodiments, the connection part 1120 may be an independent structure relative to the impedance device. The connection part 1120 may be located on a side of the mass part 1141 away from the elastic part 1142, and be spaced apart from the mass part 1141. The vibration unit 1110 may be located between the connection part 1120 and the mass part 1141. The pressure for coupling the vibration unit 1110 and the impedance device 1140 may be adjusted by adjusting the position of the connection part 1120.

In some embodiments, the system 1100 may further include a damping structure 1105, the damping structure 1105 is located on the side of the mass part 1141 away from the elastic part 1142, and is spaced apart from the mass part 1141. The vibration unit 1110 is located between the damping structure 1105 and the mass part 1141. In some embodiments, a material of the damping structure 1105 has porous pores, such as compressed foam, to provide damping to the movement of the vibration unit 1110, thereby simulating a scene where the vibration unit 1110 is worn near a tragus of a human body.

It should be noted that the damping structure 1105 or the impedance device 1140 shown in FIG. 11 may be replaced by the impedance device 200 shown in FIG. 2, the impedance device 300A shown in FIG. 3A, the impedance device 300B shown in FIG. 3B, the impedance device 300C shown in FIG. 3C, the impedance device 400 shown in FIG. 4, the impedance device 500 shown in FIG. 5, the impedance device 600 shown in FIG. 6, or the impedance device 700 shown in FIG. 7.

Figure 12:
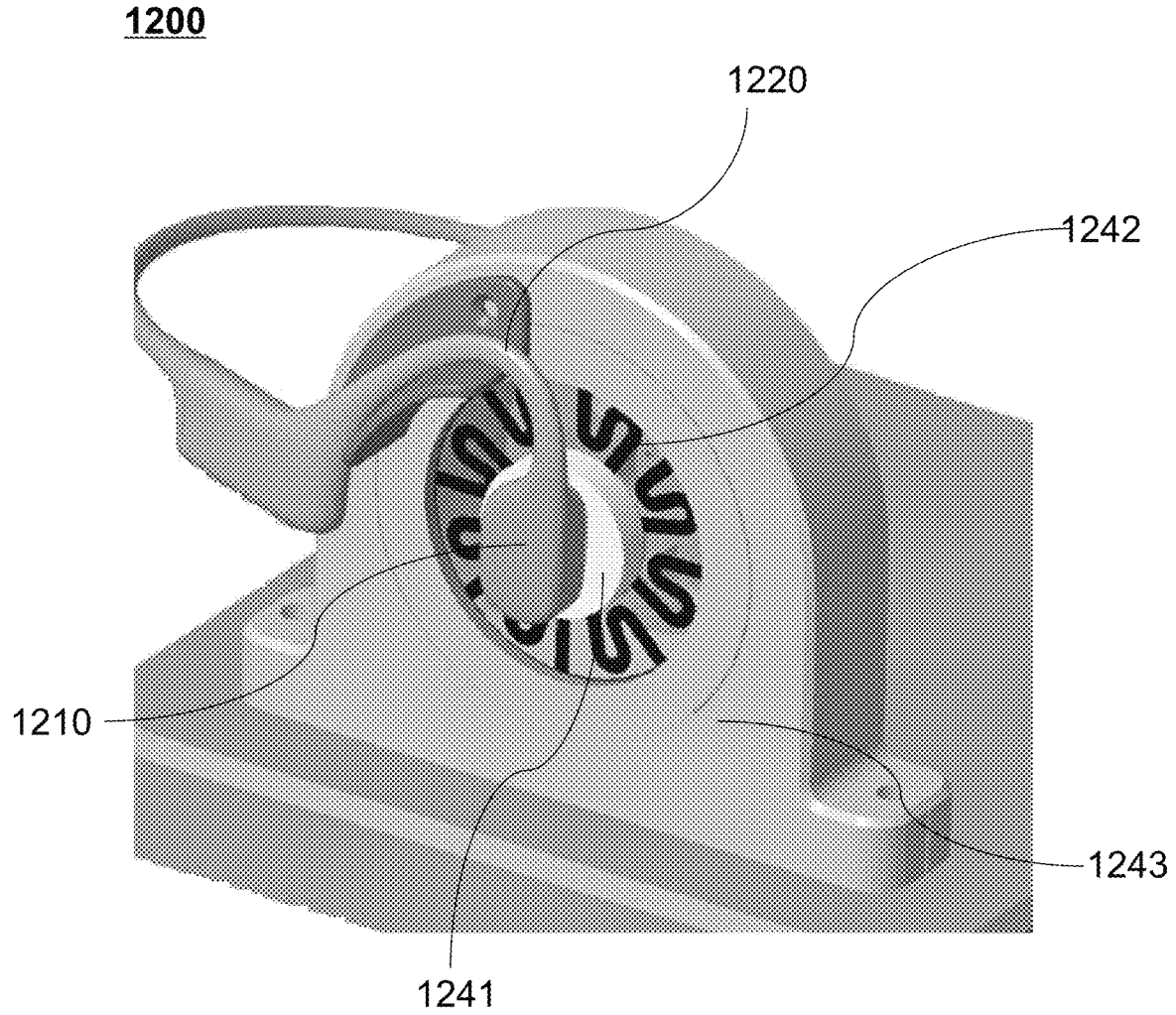
FIG. 12 is a schematic structural diagram illustrating a system for simulating an impact of a head on a vibration of a vibration unit according to some embodiments of the present disclosure.

FIG. 12 is a schematic structural diagram illustrating a system for simulating an impact of a head on a vibration of a vibration unit according to some embodiments of the present disclosure. As shown in FIG. 12, a system 1200 may include an earphone and an impedance device. The earphone may include a vibration unit 1210 (e.g., a bone conduction speaker) and a connection part 1220. The connection part 1220 may be an ear hook structure, and the ear hook structure may surround on the head of the user, and fix the vibration unit 1210 near the tragus area of the user. In some embodiments, the impedance device may include a mass part 1241, an elastic part 1242, and a fixing part 1243. The mass part 1241 is connected to the fixing part 1243 through the elastic part 1242. When the vibration unit 1210 is in a working state, the vibration unit 1210 drives the mass part 1241 to vibrate relative to the fixing part 1243 together. It should be noted that the impedance device in FIG. 12 may be replaced by the impedance device 200 shown in FIG. 2, the impedance device 300A shown in FIG. 3A, the impedance device 300B shown in FIG. 3B, the impedance device 300C shown in FIG. 3C, the impedance device 300D shown in FIG. 3D, the impedance device 400 shown in FIG. 4, the impedance device 500 shown in FIG. 5, the impedance device 600 shown in FIG. 6, or the impedance device 700 shown in FIG. 7.

It should be known that FIG. 1-FIG. 12 are only used for exemplary descriptions, and are not limited thereto. For those of ordinary skill in the art, various changes and modifications can be made based under the teaching of the present disclosure. Different embodiments may have different beneficial effects, and in different embodiments, the possible beneficial effects may be any one or a combination of several of the above, or any other possible beneficial effects.

The basic concept has been described above, obviously, for those skilled in the art, the above detailed disclosure is only an example, and does not constitute a limitation to the present disclosure. Although not expressly stated here, various modifications, improvements and amendments to the present disclosure may be made by those skilled in the art. Such modifications, improvements, and amendments are suggested in the present disclosure, so they still belong to the spirit and scope of the exemplary embodiments of the present disclosure.

Meanwhile, the present disclosure uses specific words to describe the embodiments of the present disclosure. For example, "one embodiment", "an embodiment", and/or "some embodiments" refer to a certain feature, structure or characteristic related to at least one embodiment of the present disclosure. Therefore, it should be emphasized and noted that two or more references to "an embodiment" or "one embodiment" or "an alternative embodiment" in different places in the present disclosure do not necessarily refer to the same embodiment. In addition, certain features, structures, or characteristics of one or more embodiments of the present disclosure may be properly combined.

In addition, unless explicitly stated in the claims, the order in which the application processes elements and sequences, the use of numbers and letters, or the use of other designations is not intended to limit the order of the flow and methods of the present disclosure. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various parts described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. However, this disclosure does not mean that the present disclosure object requires more features than the features mentioned in the claims. Rather, claimed subject matter may lie in less than all features of a single foregoing disclosed embodiment.

In some embodiments, numbers describing the quantity of parts and attributes are used. It should be understood that such numbers used in the description of the embodiments use the modifiers "about", "approximately" or "substantially" in some examples. Unless otherwise stated, the "about", "approximately" or "substantially" indicates that the figure enables for a variation of +20%. Accordingly, in some embodiments, the numerical parameters used in the present disclosure and claims are approximations that can vary depending upon the desired features of individual embodiments. In some embodiments, the numerical parameters should consider the specified significant digits and adopt the general digit reservation method. Although the numerical ranges and parameters used in some embodiments of the present disclosure to confirm the breadth of the scope are approximate values, in specific embodiments, such numerical values are set as precisely as practicable.

The entire contents of each patent, patent application, patent application publication, and other material, such as article, book, disclosure, publication, document, etc., cited in the present disclosure are hereby incorporated by reference into the present disclosure. Application history documents that are inconsistent with or conflict with the content of the present disclosure are excluded, as are documents (currently or hereafter appended to the present disclosure) that limit the broadest scope of the claims of the present disclosure. It should be noted that if there is any inconsistency or conflict between the descriptions, definitions, and/ or terms used in the attached materials of the present disclosure and the content thereof, the descriptions, definitions and/or terms used in the present disclosure shall prevail.

Finally, it should be understood that the embodiments of the present disclosure are only used to illustrate the principles of the embodiments of the present disclosure. Other modifications are also possible within the scope of the present disclosure. Therefore, by way of example and not limitation, alternative configurations of the embodiments of the present disclosure may be considered consistent with the teachings of the present disclosure. Accordingly, the embodiments of the present disclosure are not limited to the embodiments explicitly introduced and described in the present disclosure.

What is claimed is:

1. An impedance device for simulating an impact of a head on a vibration of a vibration unit, comprising:
   a mass part, an elastic part and a fixing part, the mass part being connected to the fixing part through the elastic part, wherein the fixing part is a hollow structure, the fixing part includes an opening, the elastic part is located at the opening and is connected to the fixing part, the elastic part forms a cavity with the fixing part, and an elastic coefficient of the elastic part in a vibration direction in which the mass part vibrates relative to the fixing part is in a range of 600 N/m~5000 N/m.

2. The impedance device of claim 1, wherein at least one hole is set on the fixing part, the at least one hole is covered with an acoustic gauze, and the acoustic gauze enables the air inside the cavity to communicate with the air outside the cavity and provides a damping.

3. The impedance device of claim 2, wherein a total area of the at least one holes occupies 10% to 90% of an area of a side wall of the fixing part where the at least one holes is located, a volume of the cavity is not more than 1000 cm$^3$, and an acoustic resistance of the acoustic gauze is in a range of 500 Rayl to 1600 Rayl.

4. The impedance device of claim 1, wherein the elastic part includes a reed structure, including a hollow area, and the hollow area enables the air inside the cavity to communicate with the air outside the cavity.

5. The impedance device of claim 4, wherein the hollow area is covered with an acoustic gauze, the acoustic gauze enables the air inside the cavity to communicate with the air outside the cavity, and the acoustic gauze provides the damping.

6. The impedance device of claim 1, wherein the elastic part includes a membranous structure connected to the fixing part through a peripheral side of the membranous structure.

7. The impedance device of claim 6, wherein one or more holes are set on the membranous structure, the one or more holes are covered with an acoustic gauze, and the acoustic gauze enables the air inside the cavity to communicate with the air outside the cavity and provides a damping.

8. The impedance device of claim 1, wherein a magnetic circuit structure is provided between the elastic part and the fixing part, the magnetic circuit structure has a magnetic gap, and a metal sheet extends from the mass part or the elastic part and protrudes into the magnetic gap.

9. The impedance device of claim 8, wherein along the vibration direction of the mass part relative to the fixing part, a projected area of the metal sheet on the magnetic circuit structure is in a range of 25 mm$^2$~400 mm$^2$.

10. The impedance device of claim 8, wherein the magnetic circuit structure includes a first magnet and a second magnet arranged at intervals in a groove, one pole of the first magnet and one pole of the second magnet are opposite to each other to form the magnetic gap.

11. The impedance device of claim 10, wherein the other pole of the first magnet and the other pole of the second magnet are connected to the fixing part.

12. The impedance device of claim 8, wherein the magnetic circuit structure and the metal sheet are a damping structure of the impedance device configured to provide a damping for movement of the mass part.

13. The impedance device of claim 1, wherein the cavity is filled with a flexible structure, and the flexible structure is in contact with the elastic part and the fixing part respectively.

14. The impedance device of claim 13, wherein the flexible structure is porous.

15. The impedance device of claim 1, wherein the impedance device includes a damping structure, the damping structure is located on a side of the mass part away from the elastic part, and is spaced apart from the mass part.

16. The impedance device of claim 1, when an external force acts on the elastic part, the impedance device provides a mechanical impedance in a range of 6 dB~50 dB, wherein, the external force is in the same direction as the vibration direction of the mass part relative to the fixing part, and the external force is in a range of 0.05 N~3.5 N.

17. The impedance device of claim 1, wherein a mass of the mass part is adjusted in a range of 0.5 g~5 g.

18. The impedance device of claim 1, wherein the elastic part is a membranous structure, and the elastic part connects with a side wall of the fixing part through its peripheral side to form a closed cavity.

19. The impedance device of claim 1, wherein a damping structure is provided on the elastic part, the damping structure provides a damping for a vibration of the elastic part, and the damping structure is made of a flexible material.

\* \* \* \* \*